(12) United States Patent
Schuster

(10) Patent No.: US 6,885,502 B2
(45) Date of Patent: Apr. 26, 2005

(54) RADIAL POLARIZATION-ROTATING OPTICAL ARRANGEMENT AND MICROLITHOGRAPHIC PROJECTION EXPOSURE SYSTEM INCORPORATING SAID ARRANGEMENT

(75) Inventor: Karl-Heinz Schuster, Königsbronn (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 10/140,895

(22) Filed: May 9, 2002

(65) Prior Publication Data

US 2002/0126380 A1 Sep. 12, 2002

Related U.S. Application Data

(62) Division of application No. 09/730,778, filed on Dec. 7, 2000, now Pat. No. 6,392,800, which is a division of application No. 09/352,408, filed on Jul. 14, 1999, now Pat. No. 6,191,880, which is a continuation of application No. 08/717,902, filed on Sep. 23, 1996, now abandoned.

(30) Foreign Application Priority Data

Sep. 23, 1995 (DE) .......................... 195 35 392

(51) Int. Cl.⁷ ............................ G02B 5/30; G03B 27/72
(52) U.S. Cl. ...................... 359/485; 359/489; 359/495; 359/497; 355/71
(58) Field of Search ................. 359/485, 489, 359/495, 497; 355/71

(56) References Cited

U.S. PATENT DOCUMENTS

| | | | |
|---|---|---|---|
| 3,213,753 A | 10/1965 | Rogers | ........................ 359/497 |
| 3,719,415 A | 3/1973 | Rawson | ........................ 359/485 |
| 3,935,444 A | 1/1976 | Zechnall et al. | ............ 359/497 |
| 4,286,843 A | 9/1981 | Reytblatt | |
| 4,755,027 A | 7/1988 | Schäfer | |
| 4,899,055 A | 2/1990 | Adams | |
| 5,365,371 A | 11/1994 | Kamon | |
| 5,375,130 A | 12/1994 | Shih | ........................... 359/483 |
| 5,436,761 A | 7/1995 | Kamon | |
| 5,467,166 A | * 11/1995 | Shiraishi | |
| 5,548,427 A | 8/1996 | May | ........................... 359/497 |

(Continued)

FOREIGN PATENT DOCUMENTS

| | | | |
|---|---|---|---|
| DE | 1572195 | 3/1970 | |
| DE | 3523641 | 12/1986 | |
| EP | 0419257 | 3/1991 | |
| EP | 0602923 | 6/1994 | |
| EP | 0608572 | 6/1994 | |
| JP | 01 143216 | 6/1989 | |
| JP | 05-226225 | 9/1993 | |
| JP | 06 160628 | 6/1994 | ................. 359/485 |
| JP | 07 176476 | 11/1995 | |
| JP | 07 307268 | 11/1995 | |

OTHER PUBLICATIONS

"Efficient radially polarized laser beam generation with a double interferometer", by S. Tidwell et al, Applied Optics, vol. 32, No. 27, 1993, pp. 5222 to 5228.

*Primary Examiner*—Ricky D. Shafer
(74) *Attorney, Agent, or Firm*—Walter Ottesen

(57) ABSTRACT

An optical arrangement is disclosed wherein an entering beam is converted into an exiting beam having a total cross section of light which is linearly polarized essentially in the radial direction by rotation. For this purpose, rasters of half-wave plates (41, 42, 4i), a combination of birefringent quarter-wave plate 420 and a circular plate 430 is suggested in combination with a conical polarizer 21'. This arrangement is preferably utilized in the illumination portion of a microlithographic projection exposure system. It is important that the arrangement be mounted behind all asymmetric or polarizing component elements 103a.

2 Claims, 5 Drawing Sheets

U.S. PATENT DOCUMENTS

| | | |
|---|---|---|
| 5,559,583 A | 9/1996 | Tanabe |
| 5,677,755 A | 10/1997 | Oshida et al. |
| 5,715,084 A | 2/1998 | Takahashi et al. |
| 6,191,880 B1 | 2/2001 | Schuster |
| 6,229,647 B1 | 5/2001 | Takahashi et al. |
| 6,392,800 B1 * | 5/2002 | Schuster |
| 6,404,482 B1 * | 6/2002 | Shiraishi |
| 2001/0022687 A1 | 9/2001 | Takahashi et al. |

* cited by examiner

RADIAL POLARIZATION-ROTATING OPTICAL ARRANGEMENT AND MICROLITHOGRAPHIC PROJECTION EXPOSURE SYSTEM INCORPORATING SAID ARRANGEMENT

This is a divisional of patent appication Ser. No. 09/730,778 filed Dec. 7, 2000 now U.S. Pat. No. 6,392,800, which is a divisional of patent application Ser. No. 09/352,408, filed Jul. 14, 1999, now U.S. Pat. No. 6,191,880 B1, which is a continuation of application Ser. No. 08/717,902, filed Sep. 23, 1996, now abandoned.

FIELD OF THE INVENTION

The invention relates to an optical arrangement which converts an entering light beam into an exiting light beam having light which is linearly polarized in the entire cross section essentially in radial direction.

BACKGROUND OF THE INVENTION

It is necessary to provide projection exposure systems with a very high numerical aperture in order to achieve the highest resolutions in microlithography. Light is coupled into the resist layer at very large angles. When this light is coupled in, the following occur: light losses because of reflection at the outer resist boundary layer and deterioration of the resolution because of lateral migration caused by reflections at the two boundary layers of the resist to the wafer and to the air (formation of standing waves).

The degree of fresnel reflection is then dependent upon the angle between the polarization direction and the reflection plane. The reflection vanishes when light having an electrical field oscillating parallel to the incident angle incidents at the brewster angle. This provides for optimal in-coupling into the resist while at the same time providing maximum suppression of the standing waves.

However, disturbances occur for light which is linearly polarized in one direction as described in U.S. Pat. Nos. 5,715,084 and 6,229,647 and U.S. Patent Application Publication US 2001/0022687 A1 as well as in European patent publication 0,608,572. Accordingly, the apparatus disclosed in these publications generate circularly polarized light which is coupled into the resist as the equivalent of unpolarized light. In this way, homogeneity is achieved over the entire image. However, a loss of efficiency is accepted because in each case, the locally perpendicular polarized light component is intensely reflected.

In U.S. Pat. Nos. 5,715,084 and 6,229,647 and U.S. Patent Application Publication 2001/0022687 A1, it is alternatively suggested that linearly polarized light should be orientated in one direction relative to the orientation of a pattern to be imaged as already disclosed in German patent publication 1,572,195. The penetration via a multiple reflection takes place in the longitudinal direction of the structures and not in the direction of the critical resolution. The efficiency of the in-coupling or the reflection at the resist surface, is however no homogeneous.

The effect of the polarization on the reflection at the resist layers and the significance of the fresnel coefficients is described in U.S. Pat. No. 4,899,055 directed to a method for measuring thickness of thin films.

U.S. Pat. No. 5,365,371 discloses a projection exposure apparatus for microlithography wherein a radially directed linear polarization of the light is introduced in order to prevent disturbances because of standing waves in the resist when generating images therein. Two different polarization elements are given, namely, a radial polarization filter composed of a positive cone and a negative cone. This filter is utilized in transmission and effects radial polarization for the reflection because of the fresnel equations. However, it is not disclosed how a complete polarization of the transmitted light is achieved. In the description of U.S. Pat. No. 5,365,371 and in claim 3 thereof, it is required in addition that both parts have different refractive indices. The transmitted part must then however be deflected and cannot pass in a straight line.

U.S. Pat. No. 5,436,761 has a disclosure identical to that of U.S. Pat. No. 5,365,371 referred to above and includes a single claim wherein no condition is given for the indices of refraction. Furthermore, in claim 4 of U.S. Pat. No. 5,365,371, a plate having segments of radially orientated polarization filter foils is given as is known from U.S. Pat. No. 4,286,843 (see FIG. 19 and column 9, lines 60 to 68).

Both polarizers are polarization filters, that is, they lead to high light loss and are suitable only for an incoming light beam which is unpolarized or circularly polarized because, otherwise, an intense nonhomogeneity of the intensity would occur over the cross section of the exiting light beam.

In the example of FIG. 1 of U.S. Pat. No. 5,365,371, the deflecting mirror 17 causes a partial polarization and therefore the light beam exiting from the polarizer 21 is nonhomogeneous.

U.S. Pat. No. 5,365,371 discloses that the radial polarizer lies in the pupillary plane of the projection objective. A position of the radial polarizer in the objective is problematical because there, the tightest tolerances for an optimal image quality must be maintained.

SUMMARY OF THE INVENTION

It is an object of the invention to provide an optical arrangement which permits a homogeneous coupling of light into optical boundary surfaces with high aperture and with low loss and low scattered light. It is another object of the invention to provide such an arrangement wherein the efficiency and the homogeneity of the exiting light beam are optimized.

Projection exposure apparatus are provided which permit maximum use of the advantages of radial linear polarization with minimum disturbance of the imaging and minimum complexity with respect to assembly.

The invention is directed to an optical arrangement which includes: an optical structure for receiving an entering light beam; the entering light beam having a linear polarization (P) in a predetermined direction; and, the optical structure being adapted to convert the entering light beam into an exiting light beam wherein the direction of the linear polarization (P) is, however, not subtractively selected but is instead rotated essentially over the entire cross section of the exiting light beam.

In this connection, it is noted that normal polarizers effect a selection. Thus, a polarization direction is permitted to pass and the orthogonals are, for example, removed from the light beam by reflection, refraction and absorption. Accordingly, unpolarized light yields a maximum of 50% linear polarized light. When linear polarized light enters a polarizer at an angle to the direction of polarization, the projection of the polarization vector is selected to the polarization direction for through passage and the orthogonals are eliminated. In contrast, in the optical arrangement of the invention, the direction of the linear polarization is actually rotated.

Advantageous embodiments are disclosed which provide different ways of generating the desired polarization distribution. One embodiment includes ring aperture illumination wherein the incident light at low angles (for which low angles the reflectivity is only slightly dependent upon polarization) is suppressed.

Another embodiment is directed to the integration of a radially polarizing optical arrangement into a microlithographic projection exposure system.

In this system, the possibilities of the optics are fully utilized and an improvement in the homogeneity and in the efficiency of coupling light into the resist layer is achieved because the reflection at the resist layer is reduced uniformly. However, uniform reduction is also achieved at all lenses arranged downstream of the polarizing element. For the light incident at large angles (up to the brewster angle), the effect is the greatest especially where the light intensity (peripheral decay) is at the lowest. The disturbances of the resolution because of scattered light, even at the resist wafer boundary layer, are homogenized and reduced.

An arrangement close to start of the beam path is advantageous because the disturbances caused by stress-induced birefringence at all downstream lenses is minimized and made symmetrical.

For this reason, it is also advantageous for polarization filters (in addition to the preferred polarization-rotating elements) when these elements are mounted in the illuminating system.

In another embodiment, the polarization-rotating elements are mounted at any desired location in a projection illuminating system which is characterized by improved homogeneity and a much higher efficiency compared to the state of the art.

In another embodiment, a reduction and homogenization of the scattered light occurs at each lens of the system (even with a low angle of incidence).

On the other hand, asymmetrical optical elements change the state of polarization and can therefore only be arranged downstream when a reflecting layer having phase correction is utilized. This is especially the case for deflecting mirrors such as for shortening the structural length or as provided in catadioptric projection objectives. If a totally-reflecting prism is utilized as a deflecting element, then a precisely adapted phase-retarding plate must be mounted downstream or the totally reflecting boundary layer must be coated with a phase-correcting layer. Polarizing optical elements such as polarization beam splitters and quarter-wave plates are also disturbing.

The invention is also directed to a microlithographic projection exposure system incorporating a radially polarizing optical arrangement. More specifically, the microlithographic projection exposure system of the invention includes: a light source defining an optical axis and transmitting a light beam along the optical axis; an optical structure arranged on the optical axis for receiving the light beam; the entering light beam having a linear polarization (P) in a predetermined direction; and, the optical structure being adapted to convert the entering light beam into an exiting light beam wherein the direction of the linear polarization (P) is rotated essentially over the entire cross section of the exiting light beam.

BRIEF DESCRIPTION OF THE DRAWINGS

The invention will now be described with reference to the drawings wherein:

FIG. 1b shows the polarization directions of the light beam exiting from the arrangement of FIG. 1a;

FIG. 4b is a plan view of the quarter-wave plate of the arrangement of FIG. 4a;

FIG. 4c is a plan view of the compressive-strain plate of the arrangement of FIG. 4a;

FIG. 4d is a plan view of the birefringent 450 plate corresponding to the arrangement of FIG. 4a;

DESCRIPTION OF THE PREFERRED EMBODIMENTS OF THE INVENTION

Figure 1A:
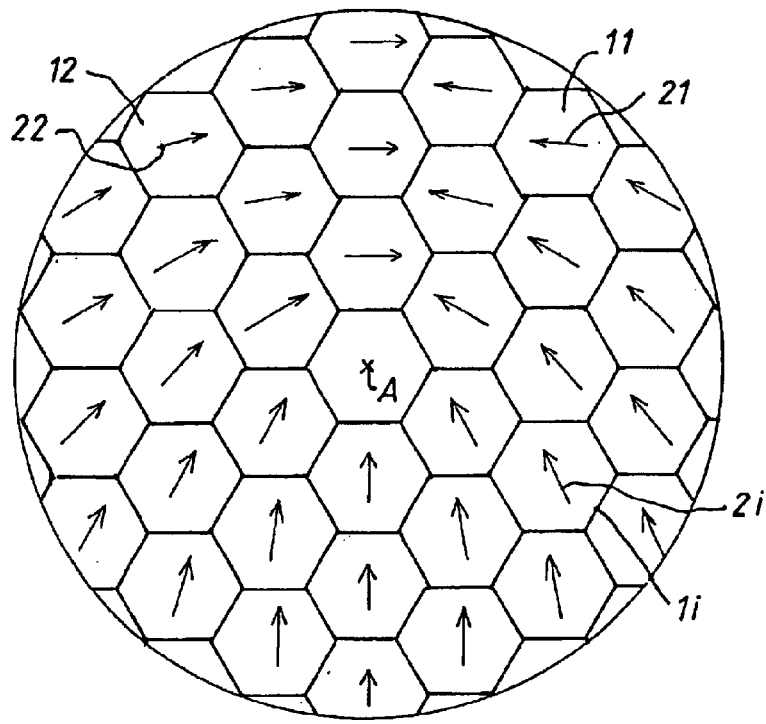
FIG. 1a is a plan view of a radially polarization-rotating optical arrangement of a raster of half-wave plates for linearly polarized incident light.
Figure 1B:
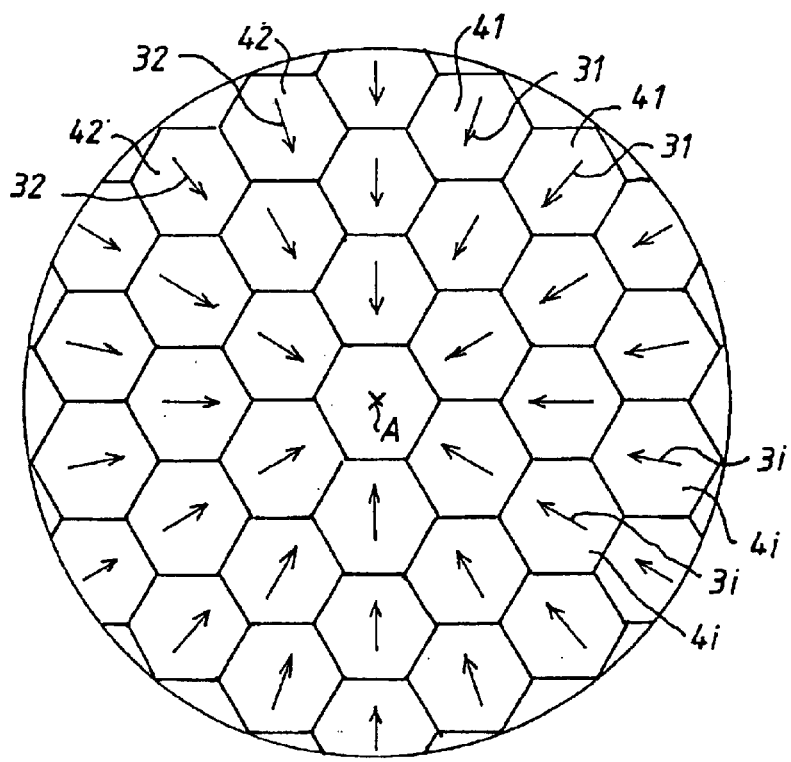

A polarization-rotating arrangement according to the invention is shown in FIGS. 1a and 1b as it is suitable especially in combination with a honeycomb condenser for the conversion of linearly polarized light. This arrangement is especially suited for lasers as a light source. The beam cross section is subdivided into a multiplicity of facets (11, 12, 1i) which is, in each case, made of a half-wave plate of birefringent material. Each facet 1i corresponds to a honeycomb element of the honeycomb condenser. The facets 1i are preferably cemented to the honeycomb or placed in wringing contact therewith. For extreme radiation loads, the facets can be separately held and coated to prevent reflection. The honeycomb condensers conventional for microlithographic projection exposure systems have about $10^2$ honeycomb elements and the number of the facets is the same.

The main axes (21, 22, 2i) of the facets (11, 1i) are each aligned in the direction of the angle bisector between the polarization direction of the entering linearly polarized light and the radius (which is aligned to the particular optical axis A of the light beam and of the honeycomb condenser) through the center of each facet 1i. In this way, each half-wave plate facet 1i effects the rotation of the polarization direction in the direction of the above-mentioned radius. FIG. 1b shows this effect. Here, the entry surfaces (41, 42, 4i) of the honeycomb condenser are shown with the polarization directions (31, 32, 3i) of the particular component beams which are all aligned radially.

The raster with hexagonal facets 1i is only one embodiment which is especially adapted for the combination with a honeycomb condenser. Other rasters and especially fan-shaped sector subdivisions of the half-wave plates (see FIG. 3b) are also possible. The number of the individual elements can then be in the area of $10^1$.

A reduction of the total degree of reflection at an optical boundary surface compared to unpolarized light takes place so long as the component of the light, which is polarized perpendicularly to the plane of incidence, is less than the component of the parallelly polarized light. This boundary case is achieved with only four 90° sectors having half-wave plates so that, preferably, more half-wave plates are arranged in the cross section of the light beam especially in the order of magnitude of 10 to $10^2$ facets or sectors.

In contrast to the known radial polarizers with sectors as shown in U.S. Pat. Nos. 4,286,843 and 5,365,371, the polarization is filtered out with an insignificant amount of loss; instead, the light is changed at minimal loss in its polarization direction via birefringent elements.

Figure 2:
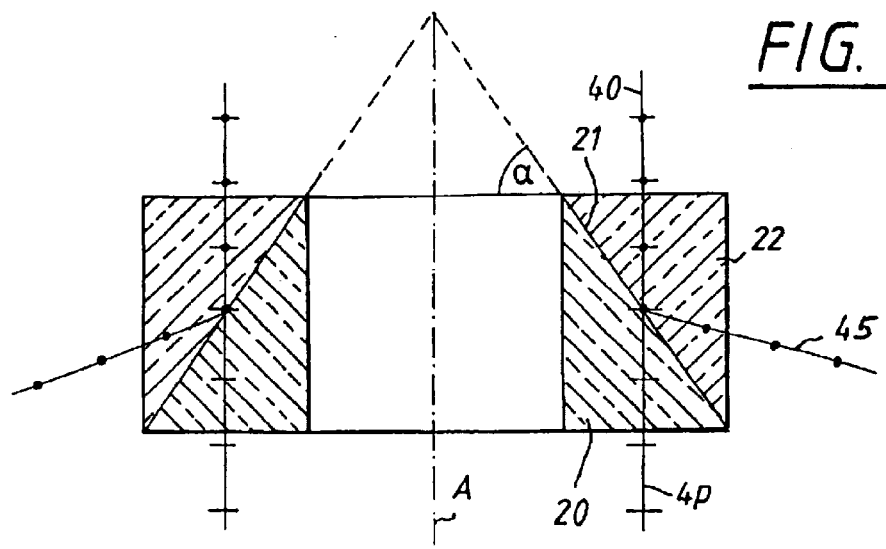
FIG. 2 is an elevation view, in section, of a radially polarizing optical arrangement having a conical-frustrum reflector having a brewster angle for circularly polarized or non-polarized incident light.

The arrangement shown in FIG. 2 effects a continuous radial direction of the linear polarization for entering unpolarized or circularly polarized light 40. This arrangement is a polarization filter and is basically known from U.S. Pat. No. 5,365,371 but is new with respect to its details.

The conical frustrum 20 has a through bore and is made of a transparent material, such as glass FK5, quartz glass or $CaF_2$, with the conical angle a corresponding to the brewster angle and a dielectric reflection coating on the conical surface 21. The component 45 of the light beam 40 is polarized perpendicularly to the incident plane and is therefore completely reflected. The transmitted beam 4p is polarized completely parallel to the incident plane and is therefore everywhere linearly polarized radially to the optical axis A. The conical frustrum 20 is adapted for an annular aperture illumination and ensures the shortest structural length. A complete cone is also suitable. The conical frustrum 20 is supplemented by a suitable hollow cone 22 to form a cylinder ring whereby the reflective conical surface 21 is protected and the entire structure is easier to mount. The conical frustrum 20 and the hollow cone 22 have the same index of refraction so that the light passing therethrough does so without refraction at the conical surface 21, which is in contrast to U.S. Pat. No. 5,365,371.

Figure 3A:
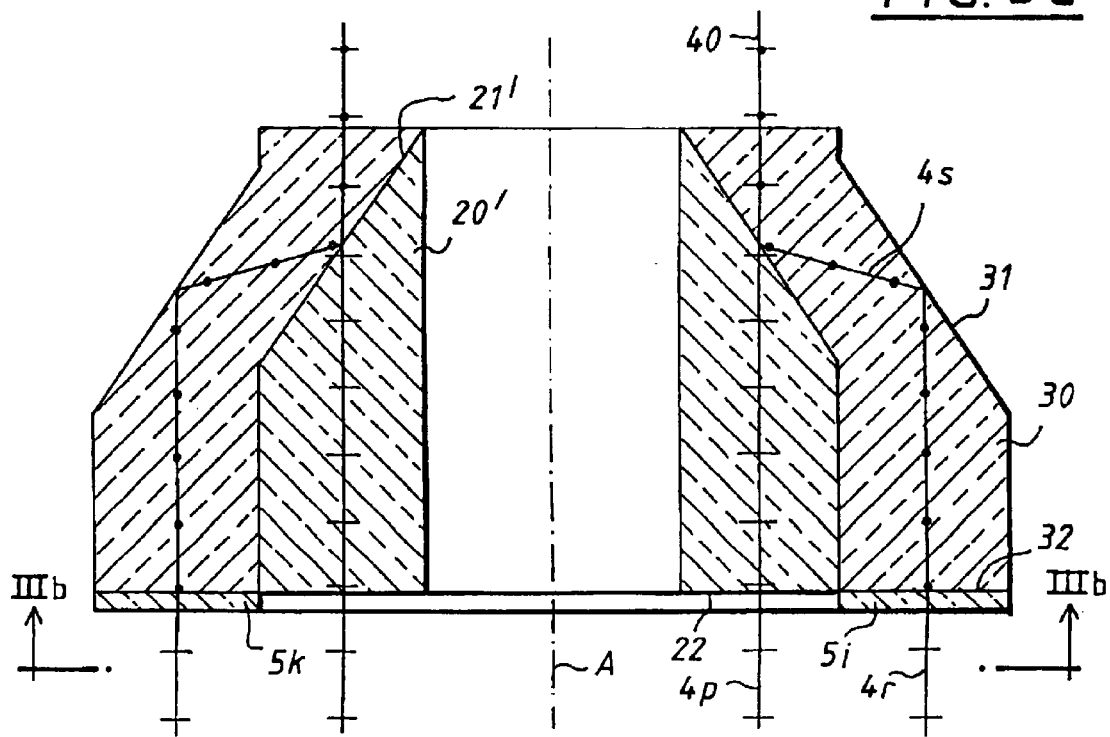
FIG. 3a is an arrangement incorporating a conical-frustrum reflector and segmented half-wave plates for complete utilization of circularly-polarized light or non-polarized light.

FIG. 3a shows, in section, a further embodiment of that shown in FIG. 2 wherein the reflective component 4s is also utilized so that an arrangement with a substantially lower than 50% light loss is achieved because the polarization is effectively rotated and not filtered.

Figure 3B:
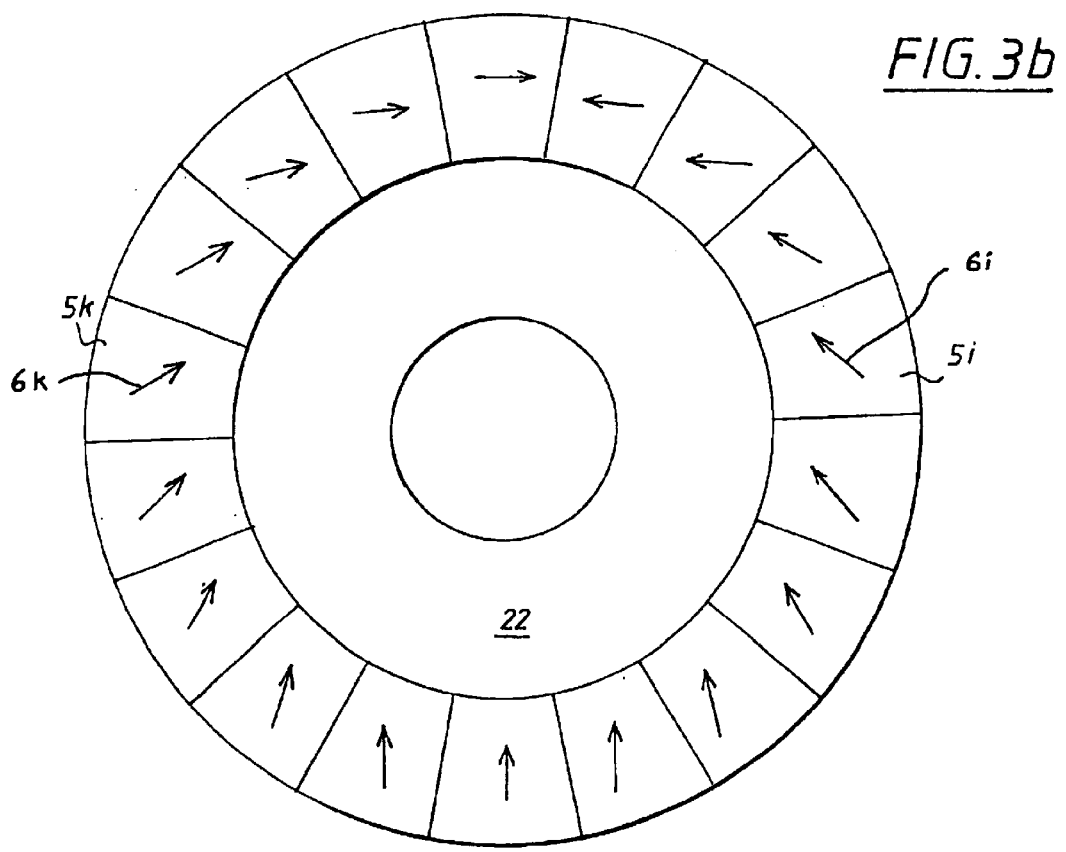
FIG. 3b is a plan view of the arrangement of FIG. 3a as viewed from the light exit end thereof.

A transparent part 30 having a conical surface 31 is mounted about the conical frustrum 20' having the conical surface 21' corresponding to FIG. 2 (with an extending cylindrical extension portion). The transparent part 30 has a reflective cone surface 31 parallel to the conical surface 21'. A ring of segments (5i, 5k) of half-wave plates is mounted on the exit surface 32 of the part 30. The main axes (6i, 6k) of the segments are at 45° to the radius in the segment center as shown in FIG. 3b. In this way, and as described with respect to FIG. 1, the radial linear polarization is effected also of the light 4s reflected at the conical surface 21' in the beam 4r parallel to the axis. The effected increase of the light-conductance value is often desired at least for laser light sources. It is important that the arrangement is suitable for unpolarized incident light. By omitting or adding optical glass, the optical path of conical frustrum 20' and transparent part 30 can be adapted.

An arrangement for continuously generating radially linear polarized light is shown in FIGS. 4a to 4d. Here, the arrangement is for linearly or circularly polarized light at the input with reduced structural length in the direction of the optical axis. It is especially suitable for annular aperture optics.

Figure 4A:
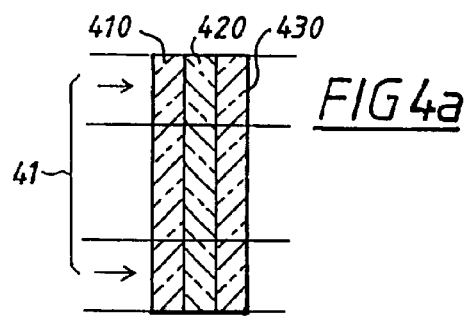
FIG. 4a is a radial polarization-rotating optical arrangement having a plate with a central-symmetrical stress-induced birefringence.
Figure 4B:
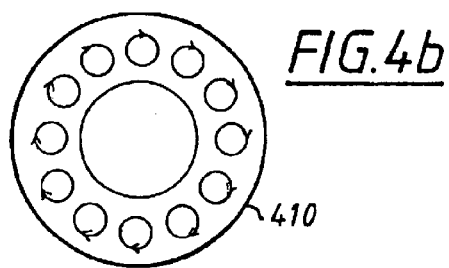
Figure 4C:
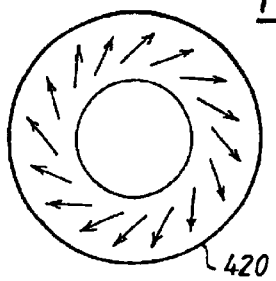

An annular beam of uniformly linear polarized light 41 impinges on a stack of three planar plates (410, 420, 430) as shown in section in FIG. 4a. Planar plate 410 is a quarter-wave plate which, as FIG. 4b shows, circularly polarizes the through-passing light. If the entering beam is already circularly polarized, then the plate 410 can be omitted. A plate 420 follows and can, for example, be made of glass or quartz glass. The plate 420 is under centrally-symmetrical pressure stress and has therefore stress-induced birefringence. Thickness, material and stress are so selected that the plate 420 is a quarter-wave plate in the outer region touched by the annular beam 41 but with radial symmetry so that the circularly polarized entering light is linearly polarized and with the polarization direction at 45° to the radius over the entire cross section as shown in FIG. 4c.

Such a pressure stress always accompanies thermal expansion and temperature gradients when cooling or a compensating thermal treatment in circularly round glass plates (or plates of quartz glass, berylliumfluoride, $CaF_2$ et cetera). The pressure stress is normally minimized with the longest possible cooling. Via deliberate cooling, the desired pressure stress can be generated within wide limits and therefore the desired stress-induced birefringence is generated in the exterior region.

Figure 4D:
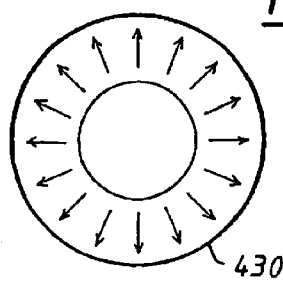

A third plate 430 follows which has circular birefringence and rotates the polarization direction by 45°. In this way, and as shown in FIG. 4d, the radial polarization of the exiting light extends over the entire cross section.

As in the embodiment of FIGS. 1a and 1b, this embodiment affords the advantage of being especially thin and, as shown in the embodiment of FIG. 2, has the advantage that precise radial polarization is provided without complex assembly of many facets or segments. The main advantage is also the high efficiency because the polarization is rotated and not selected. If, in lieu of an annular beam 41, a complete beam is transmitted through the arrangement, then the core area is simply not influenced.

Figure 5:
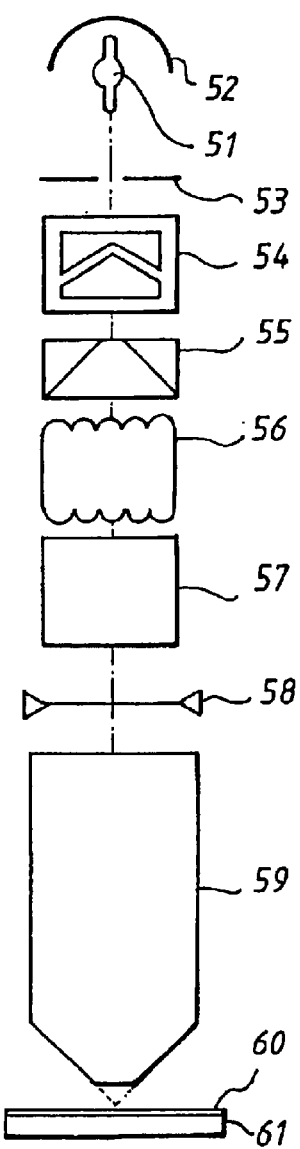
FIG. 5 is a schematic representation of a microlithographic projection exposure system incorporating a radially polarizing optical arrangement in the illumination portion thereof.

FIG. 5 is a schematic showing a complete microlithographic projection exposure system with a radially polarizing optical arrangement 55 which is here in the form of a conical-frustum polarizer according to FIG. 2. Except for this element and its mounting, all components and their arrangement are conventional. A light source 51, for example, an i-line mercury discharge lamp having mirror 52, illuminates a diaphragm 53. The i-line mercury lamp is tuned to the i-line (atomic emission spectral line of mercury having a wavelength of 358 nm) and is conventionally used in microlithography. An objective 54 (for example, a zoom axicon objective as disclosed in German patent publication 4,421,053) follows and makes possible various adjustments, especially the selection of an annular aperture.

The conical-frustum polarizer 55, which is suitable for unpolarized entering light, is followed by: a honeycomb condenser 56 and a relay and field optic 57. These parts together serve to optimize illumination of the reticle 58 (the mask) which is imaged by the projection objective 59 at a reduced scale and with the highest resolution (below 1 μm) on the resist film 60 of the wafer 61. The numerical aperture of the system lies in the range of values above 0.5 to 0.9. Annular apertures between 0.7 and 0.9 are preferred. The radial polarization of the light after leaving the conical-frustrum polarizer 55 causes the effect of the stress-induced birefringence to be rotationally symmetrical with respect to the optical axis at all of the following optical elements (56, 57, 58, 59). The effect is the greatest at the entrance into the resist film 60 where the largest inlet angles occur and therefore optimal transmission and minimum reflection are achieved. The sensitive beam path in the projection objective 59 is undisturbed.

The embodiment of the polarizing optical arrangement 55 is not limited to the embodiment of FIG. 2. Especially all polarization-rotating arrangements can be used and, if needed, a polarizer or birefringent plate can be mounted forward of the arrangement for adaptation. Also, a polarization-rotating optical arrangement 55 can be placed at other locations in the overall configuration.

Figure 7:
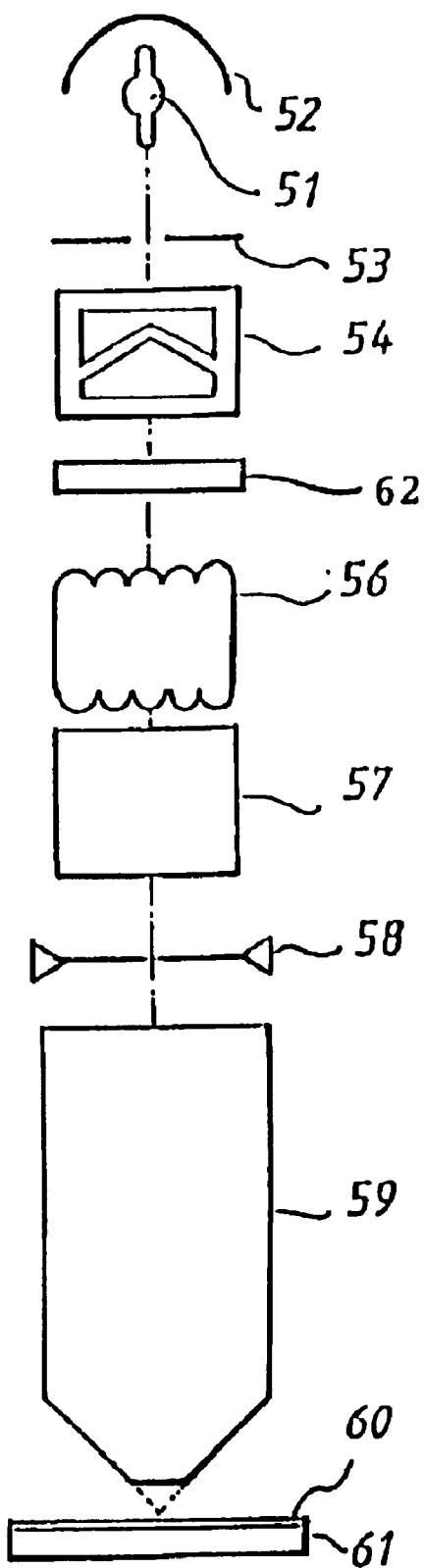

As noted above, all polarization-rotating arrangements can be used and FIG. 7 shows an embodiment of a microlithographic projection exposure system incorporating the radially polarization-rotating optical arrangement 62 shown in detail in FIGS. 1a and 1b.

This is especially true when deflection mirrors without phase correction or polarizing elements, such as polarization beam splitters, are used. Then, the polarization-rotating optical arrangement according to the invention is placed behind these elements as viewed in light flow direction. One embodiment is shown in FIG. 6 in the context of a catadioptric projection objective.

Figure 6:
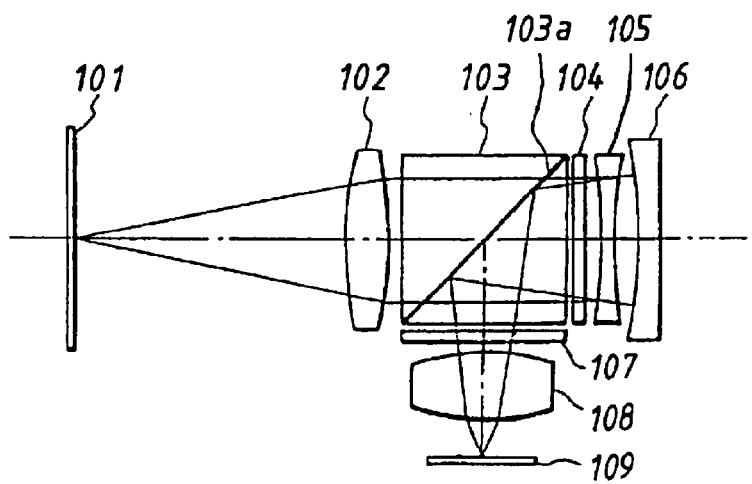
FIG. 6 is a schematic representation of a catadioptric projection objective having a radially polarizing optical arrangement of the invention incorporated therein; and, FIG. 7 is a schematic representation of a microlithographic projection exposure system incorporating the radially polarization-rotating optical arrangement of a half raster of wave plates as shown in FIGS. 1a and 1b.

FIG. 6 corresponds completely to FIG. 1 of European patent publication 0,602,923 having polarizing beam splitter 103, concave mirror 106, lens groups (102, 105, 108) and quarter-wave plate 104. The polarization-rotating optical element 107 is, however, not a quarter-wave plate for circular polarization and therefore uniform deterioration of the coupling in of light into the resist 109, as described initially herein with respect to European patent publication 0,602,923. The polarization-rotating optical element 107 also is not a means for aligning the uniform linear polarization to a preferred direction of the pattern on the reticle 101. Rather, a radial polarization-rotating optical arrangement 107 is provided in FIG. 6.

The embodiments of FIGS. 1a, 1b and 4a are the best suited here because of the small amount of space available. The advantage is clear, namely, independently of the pattern of the individual case, optimal scatter light suppression and uniform efficiency of the incoupling of light into the resist 109 is achieved.

The radial polarizing optical arrangement 107 is mounted as close as possible behind the deflecting mirror 103a in the almost completely collimated beam path, that is, in a range of moderate angles and divergences of the light rays. Small angles are important for a trouble-free functioning of the birefringent elements. The best effect is achieved when the exit plane of the polarization-rotating elements lies in a plane of the illumination or projection system which is fourier-transformed to the image plane or in a plane equivalent thereto.

The use of the polarization-rotating optical arrangement, which generates a radially orientated linear polarization on the total beam cross section, is not limited to microlithography.

It is understood that the foregoing description is that of the preferred embodiments of the invention and that various changes and modifications may be made thereto without departing from the spirit and scope of the invention as defined in the appended claims.

What is claimed is:

1. A microlithographic projection exposure system comprising:

a light source defining an optical axis and transmitting a light beam along said axis toward an object;

a reticle mounted on said axis for receiving said light beam and transmitting said light beam down said optical axis;

a catadioptric projection objective mounted on said optical axis downstream of said reticle; and, said catadioptric projection objective including a polarizing beam splitter and a radial polarization-rotating optical arrangement mounted downstream of said polarizing beam splitter generating a radially orientated linear polarization on the total cross section of said light beam directed toward said object.

2. The microlithographic projection exposure system of claim 1, wherein said radial polarization-rotating optical arrangement comprises:

an optical structure for receiving an entering light beam;

said entering light beam having a linear polarization (P) in a predetermined direction;

said optical structure being adapted to convert said entering light bean into an exiting light beam wherein said direction of said linear polarization (P) is rotated essentially over the entire cross section of said exiting light beam;

said entering light beam defining an optical axis (A) and said optical structure including a frame and more than four half-wave plates disposed in a raster, segment or facet configuration;

said half-wave plates having respective preferred directions so arranged that each half-wave plate deflects the polarization direction of the penetrating linear polarized light in the direction of a radius which cuts through the corresponding half-wave plate and is directed to said optical axis;

a reflective polarizer having a conical surface shaped polarizing surface or a conical-frustrum surface shaped polarizing surface; and, said half-wave plates being mounted in the beam path of the light reflected at said reflection polarizer.

* * * * *

UNITED STATES PATENT AND TRADEMARK OFFICE
CERTIFICATE OF CORRECTION

PATENT NO.    : 6,885,502 B2
DATED         : April 26, 2005
INVENTOR(S)   : Karl-Heinz Schuster It is certified that error appears in the above-identified patent and that said Letters Patent is hereby corrected as shown below:

Column 1,
Line 8, delete "778" and substitute -- 778, -- therefor.
Line 59, delete "no" and substitute -- not -- therefor.

Column 4,
Line 24, delete "450" and subtitute -- 45° -- therefor.

Column 5,
Line 29, delete "a" and substitute -- α -- therefor.

Column 8,
Line 35, delete "bean" and substitute -- beam -- therefor.

Signed and Sealed this

Fifth Day of July, 2005

JON W. DUDAS
*Director of the United States Patent and Trademark Office*